United States Patent
Faleev et al.

(10) Patent No.: US 9,666,215 B2
(45) Date of Patent: May 30, 2017

(54) TERMINATION LAYER-COMPENSATED TUNNELING MAGNETORESISTANCE IN FERRIMAGNETIC HEUSLER COMPOUNDS WITH HIGH PERPENDICULAR MAGNETIC ANISOTROPY

(71) Applicant: INTERNATIONAL BUSINESS MACHINES CORPORATION, Armonk, NY (US)

(72) Inventors: Sergey V. Faleev, Santa Clara, CA (US); Jaewoo Jeong, Santa Clara, CA (US); Stuart S. P. Parkin, Santa Clara, CA (US); Mahesh G. Samant, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/925,729

(22) Filed: Oct. 28, 2015

(65) Prior Publication Data

US 2017/0125045 A1 May 4, 2017

(51) Int. Cl.
| | |
|---|---|
| *G11C 11/00* | (2006.01) |
| *G11B 5/39* | (2006.01) |
| *H01F 10/32* | (2006.01) |
| *G11C 11/16* | (2006.01) |
| *G11C 11/15* | (2006.01) |

(52) U.S. Cl.
CPC ............ *G11B 5/3909* (2013.01); *G11C 11/16* (2013.01); *H01F 10/3254* (2013.01); *H01F 10/3286* (2013.01); *G11C 11/15* (2013.01)

(58) Field of Classification Search
CPC . G11C 14/0081; G11C 16/105; G11C 16/107; G11C 19/0841; G11C 2029/5006; G11C 11/161; G11C 11/1675; G11C 11/1673; G11C 11/16; G11C 13/0069; G11C 11/15; G11C 11/1659; G11C 13/004; G11C 11/00; G11C 11/02; G11C 11/18; G11C 11/419; G11C 11/5607; G11C 13/003; H01L 43/04; H01L 43/065; H01L 43/06; H01L 43/14; H01F 10/3286;
(Continued)

(56) References Cited

U.S. PATENT DOCUMENTS

| | | |
|---|---|---|
| 6,625,059 B1 | 9/2003 | Sharma et al. |
| 7,348,647 B2 | 3/2008 | Mattheis et al. |

(Continued)

OTHER PUBLICATIONS

Ikeda et al., "A perpendicular-anisotropy CoFeB—MgO magnetic tunnel junction", Nature Materials, vol. 9, pp. 721-724, (Sep. 2010).
(Continued)

*Primary Examiner* — Son Dinh
*Assistant Examiner* — Uyen B Tran
(74) *Attorney, Agent, or Firm* — Daniel E. Johnson

(57) ABSTRACT

A layered stack includes a first layer having a first spin polarization and a first magnetic moment, as well as a second layer (in contact with the first layer) having a second spin polarization a second magnetic moment. The first and second spin polarizations have the same orientation, but the first and second magnetic moments have orientations that partially cancel each other, thereby recommending the layered stack for applications in magnetic tunnel junctions, for example.

15 Claims, 15 Drawing Sheets

(58) Field of Classification Search
CPC .. H01F 10/329; H01F 10/3254; H01F 41/302; H01F 10/30; H01F 10/32; H01F 10/3272
See application file for complete search history.

(56) References Cited

U.S. PATENT DOCUMENTS

| | | | |
|---|---|---|---|
| 8,659,102 B2 | 2/2014 | Shoji | |
| 9,076,954 B2 | 7/2015 | Khvalkovskiy et al. | |
| 2009/0080239 A1* | 3/2009 | Nagase | H01L 27/228 365/158 |
| 2011/0064969 A1* | 3/2011 | Chen | B82Y 25/00 428/800 |
| 2012/0223374 A1* | 9/2012 | Morooka | H01L 27/10826 257/295 |
| 2013/0083593 A1 | 4/2013 | Prejbeanu et al. | |
| 2014/0175574 A1* | 6/2014 | Watts | H01L 29/82 257/421 |
| 2014/0301136 A1* | 10/2014 | Inokuchi | G11C 11/161 365/158 |
| 2015/0263270 A1* | 9/2015 | Kitagawa | H01L 27/228 257/421 |
| 2016/0072049 A1* | 3/2016 | Noma | G11B 5/314 257/421 |

OTHER PUBLICATIONS

Kurt et al., "Magnetic and electronic properties of D022-Mn3Ge (001) films", Applied Physics Letters, vol. 101, pp. 132410-1 to 132410-3, (2012).

Miura et al., "Theoretical study on tunneling magnetoresistance of magnetic tunnel tunctions with D022-Mn3Z (Z=Ga, Ge)", IEEE Transaction on Magnetics, vol. 50, No. 1, pp. 1400504, (Jan. 2014).

Parkin, et al., "Giant tunnelling magnetoresistance at room temperature with MgO (100) tunnel barriers", Nature Materials, vol. 3, pp. 862-867, (Dec. 2004).

Zhang et al., "First-principles study of the structural stability of cubic, tetragonal and hexagonal phases in Mn3Z (Z=Ga, Sn and Ge) Heusler compounds", Journal of Physics: Condensed Matter, vol. 25, pp. 1-6, (2013).

* cited by examiner

US 9,666,215 B2

TERMINATION LAYER-COMPENSATED TUNNELING MAGNETORESISTANCE IN FERRIMAGNETIC HEUSLER COMPOUNDS WITH HIGH PERPENDICULAR MAGNETIC ANISOTROPY

TECHNICAL FIELD

The invention relates to magnetic tunnel junction magnetoresistive devices, and more particularly, to a magnetic random access memory that employs such devices.

BACKGROUND

Heusler compounds have significant potential for magnetic electrodes in magnetic tunnel junction (MTJ) memory elements that require perpendicularly oriented moments. Although high tunneling spin polarization has been observed in soft, ferro-magnetic Heusler compounds, and predicted for hard, ferri-magnetic Heusler materials, such as $Mn_{3-x}Ga$ and $Mn_3Ge$, there has been no experimental observation to date of high tunneling magnetoresistance (TMR) in the latter.

SUMMARY

A preferred embodiment of the invention is a layered stack that includes a first layer having a first tunneling spin polarization and a first magnetic moment, and a second layer having a second tunneling spin polarization and a second magnetic moment; the first and second layers are in contact with each other. The first and second tunneling spin polarizations have the same orientation, whereas the first and second magnetic moments have orientations that partially cancel each other.

One preferred aspect of the invention is a method, in which current is passed through the layered stack, with the stack acting as a reference layer in a storage device. Another preferred aspect of the invention is a method, in which current is passed through the layered stack, with the stack acting as a free layer in a storage device. That is, the layered stack can be incorporated into a magnetic tunnel junction device (a storage device).

BRIEF DESCRIPTION OF THE DRAWINGS

FIGS. 1B and 1D are schematics of the MTJ structures grown on Si(001)/SiO$_2$ and MgO(001) substrates, respectively. In some cases a TaN diffusion barrier layer was used. For characterization of structural, topographical and magnetic properties of the $Mn_3Ge$ films, a 30 Å Ta film was used as a capping layer instead of the uppermost layers Ru, Ta, CoFeB, and MgO.

FIG. 1C Top panel—magnetic moment m extrapolated from FIG. 1A versus $Mn_3Ge$ thickness. The solid straight line shows the calculated moment of bulk $D0_{22}$-$Mn_3Ge^{10}$. Bottom panel—coercive field H$_C$ (solid triangles) and uniaxial magnetic anisotropy constant K$_U$ (empty squares). As shown in FIG. 1A, the $Mn_3Ge$ magnetization cannot be saturated in-plane using the available magnetic field (7 T); thus, H$_{eff}$ is a lower bound.

FIG. 2B Temperature dependence of TMR (top panel), and R$_P$A and R$_{AP}$A (bottom panel).

FIG. 2C MgO thickness dependence of TMR (open symbols) and R$_{AP}$A product (solid symbols), averaged over more than 20 devices. Solid and dashed lines are guides to the eye for R$_{AP}$A and TMR, respectively. R$_{AP}$A scales exponentially with barrier thickness.

FIG. 2D HRTEM image of an MTJ device ~27 nm in size, with the structure: Si/250 Å SiO$_2$/200 Å TaN/200 Å IrMn$_3$/300 Å $Mn_3Ge$/15 Å MgO/15 Å CoFeB/50 Å Ta/50 Å Ru.

FIG. 3A Out-of-plane M vs. H hysteresis loops, at 300 K, of 300 Å thick $Mn_2CuSb$ films grown on a MC MgO(001) substrate at room temperature and post-annealed at 300° C. (squares) and 400° C. (circles) for 30 min. The anneal treatments were carried out in a high-vacuum anneal furnace, in an applied magnetic field of 1 T (out-of-plane direction) for 30 min.

FIG. 3B Out-of-plane m vs. H hysteresis loop of an MTJ film measured before lithography patterning.

FIG. 3C Two-terminal junction R vs. H loop of a patterned MTJ device (1×2 μm$^2$ size).

FIG. 3D Schematic of a $Mn_2CuSb$ based MTJ, with the structure: MgO(001)/20 Å A 400 Å Cr/300 Å $Mn_2CuSb$/25 Å MgO/14 Å CoFeB/4 Å Ta/7 Å CoFeB/50 Å Ta/100 Å Ru. The $Mn_2CuSb$ electrode was deposited at 300 K and in-situ annealed at 300° C. before the MgO barrier deposition. The entire stack was then post-annealed at 325° C. for 30 min.

FIG. 4A TMR for $Mn_3Ge$/MgO/Fe and Fe/MgO/Fe MTJs versus N$_{MgO}$. TMR for $Mn_3Ge$/MgO/Fe MTJ with Mn—Mn termination is shown by solid squares, and with Mn—Ge termination by solid circles; the TMR for the device with "steps" (half of the device area having Mn—Mn termination and half of the area having Mn—Ge termination) is shown by diamonds. The TMR for Fe/MgO/Fe MTJ calculated by the TB-LMTO method is shown by triangles, whereas the TMR calculated by the layer KKR method (ref. [16]) is shown by the open circles.

FIG. 4B Schematic of atomic step between two distinct terminations with opposite magnetic moments for $Mn_3Ge$. Note that the Mn—Mn layer is periodically penetrated by the MgO layer, so that the Mn—Mn layer has a crenellated structure. Arrows on each of the Mn atoms indicate the direction of local magnetic moment. Tunneling spin polarization (TSP) of each layer for intermediate MgO thickness ($4<N_{MgO}<10$) is shown on the right. Note that although the spin polarization of both native termination layers is negative; the tunneling spin polarization (spin polarization of tunneling electrons across the MgO barrier) has the opposite sign due to the BZ filtering effect.

FIG. 4C The TMR for $Mn_2CuSb/MgO/Fe$ MTJ with Mn—Sb termination is shown by solid squares and with Mn—Cu termination by circles; the TMR for the device with "steps" (half of the device area having Mn—Cu termination and half of the area having Mn—Sb termination) is shown by diamonds.

FIG. 4D Schematic of atomic step between two distinct terminations with opposite magnetic moments for $Mn_2CuSb$. Note that the Mn—Cu layer is periodically penetrated by the MgO layer, so that the Mn—Cu layer has a crenellated structure. Arrows on each of the Mn atoms indicate the direction of the local magnetic moment. The tunneling spin polarization of each layer is shown on the right.

Note that in FIG. 4A and FIG. 4C, the TMR for the termination with the larger magnetic moment is shown by solid squares for both $Mn_3Ge$ and $Mn_2CuSb$. In FIG. 4B and FIG. 4D, the direction of the magnetic moments shown for the different termination layers for the different steps corresponds to the sign of the TMR for the corresponding solid circles and solid squares, where pointing up (down) direction of the arrow is assumed to indicate positive (negative) sign. Arrows on each of the Mn atoms indicate the direction of the local magnetic moment. The tunneling spin polarization of each layer is shown on the right.

DETAILED DESCRIPTION

Figure 1A:
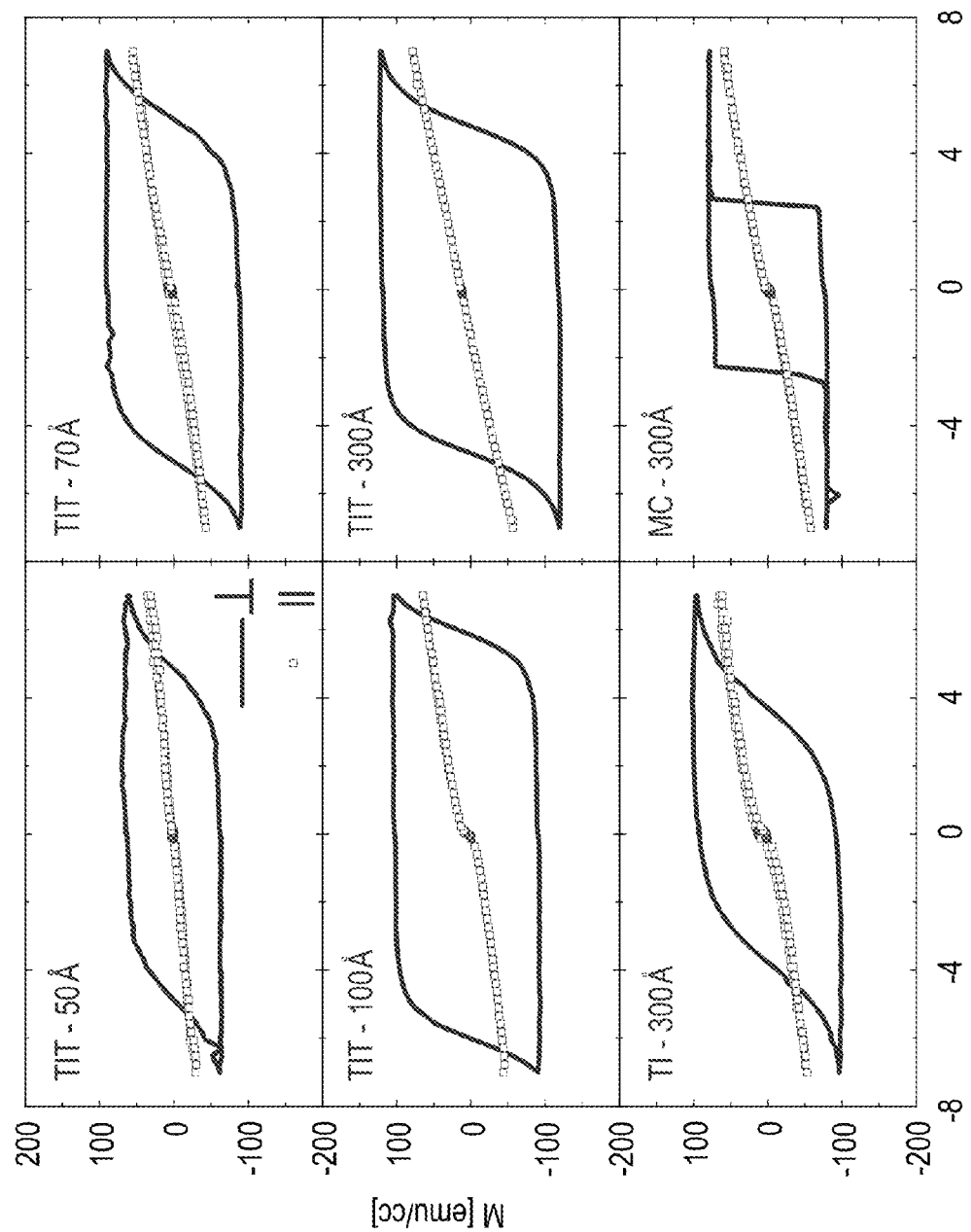
FIGS. 1A, 1B, 1C, and 1D. $Mn_3Ge$ Hensler Films with Giant Perpendicular Magnetic Anisotropy FIG. 1A Magnetization (M) vs. field (H) hysteresis loops of $Mn_3Ge$ films grown on a Si(001)/SiO$_2$ substrate with "TI" (TaN/IrMn$_3$; bottom left panel) and "TIT" (TaN/IrMn$_3$/TaN; top four panels) underlayers, as well as a MgO(001) substrate with "MC" (MgO/Cr; bottom right panel) underlayers. TI (TIT) have the following structure: Si(001)/SiO$_2$/200 Å TaN/200 Å IrMn$_3$ (/10 Å TaN), while MC has the following structure: MgO(001)/20 Å MgO/400 Å Cr. For the TIT films, the thickness of the $Mn_3Ge$ layer, deposited using the 3-step process, was varied. Out-of-plane (in-plane) M vs. H loops are shown as solid lines (open squares).

We report the preparation of highly textured, polycrystalline $Mn_3Ge$ films on amorphous substrates, with very high magnetic anisotropy fields exceeding 7 T, making them technologically relevant. However, the TMR is negative and much smaller than theoretical predictions for tunnel junction devices formed with MgO tunnel barriers. This is attributed to dominant tunneling from the lower moment Mn—Ge termination layers, which have a magnetization opposite to that of the higher moment Mn—Mn layers. The net spin polarization of the current reflects the different proportions of the two distinct termination layers and their associated tunneling matrix elements at the tunnel barrier interface. A second perpendicularly magnetized Heusler compound, $Mn_2CuSb$, identified by computational materials discovery methods, likewise displays small TMR, but in that case the sign of the tunneling spin polarization of each of the termination layers is opposite to that of their magnetization, in contrast to $Mn_3Ge$. Therefore, the low TMR found in $Mn_3Ge$ and $Mn_2CuSb$, attributed herein to termination layer compensation, is not an inherent property of ferrimagnetic Heuslers. The tunneling spin polarization of the two termination layers can be engineered to be of the same sign even though these layers are oppositely magnetized, therefore providing a path to low magnetization electrodes with high TMR for high density spin transfer torque MRAM (magnetic random access memory) applications.

Key to the successful development of magnetic random access memory (MRAM), one of the most promising emerging non-volatile memory technologies, are magnetic materials (for the magnetic tunnel junction memory elements) that have sufficient stability against thermal fluctuations to sustain deeply scaled devices. The most promising magnetic materials to date are magnetic alloys formed from Co, Fe and B, in conjunction with MgO(001) tunnel barriers[1-3].

The magnetic electrodes must possess sufficiently high perpendicular magnetic anisotropy (PMA) that their magnetizations lie perpendicular to the plane of the MTJ device, since this allows for reduced currents to switch the magnetization of the electrode that forms the memory layer of the device using spin torque[3,4]. The PMA of a Co—Fe—B layer arises from the interface between this layer and the tunnel barrier and/or the underlayer on which the Co—Fe—B layer is deposited. Thus, a Co—Fe—B layer must be made sufficiently thin that the interface PMA overcomes the demagnetization energy that arises from the magnetic volume and increases in proportion with the magnetic volume of the Co—Fe—B layer. In practice, this means that the PMA is too weak to overcome thermal fluctuations when the device has a critical dimension less than ~20 nm in size, since the thickness of the magnetic layer has to be (i) below that required to maintain its moment perpendicular and (ii) below that needed to switch the magnetic layer with reasonable current densities. Magnetic materials in which the PMA is derived from volume magnetocrystalline anisotropy are then needed.

One of the most promising class of such materials are the Heusler alloys—compounds having the chemical formula $X_2YZ$ or $X'X''YZ$, wherein X, X', X" and Y are transition metals or lanthanides (rare-earth metals) and Z is from a main group metal[5]. Some of these compounds are ferromagnetic or ferrimagnetic, depending on the exchange interaction between the magnetic moments on the X and/or Y sites. Moreover, while the parent Heusler compounds are cubic and exhibit weak or no significant magnetic anisotropy, the structure of some of these compounds is found to be tetragonally distorted: Due to this distortion the magnetization exhibited by these compounds may be aligned along the tetragonal axis. Thus, thin films formed from such materials may exhibit PMA due to a magnetocrystalline anisotropy associated with the tetragonally distorted structure. Some examples of such tetragonal Heusler compounds are $Mn_{3-x}Ga$[6] and $Mn_3Ge$[7].

Thin films of these materials have been shown to exhibit large PMA but, to date, all work on these materials has involved films that are grown epitaxially on single crystalline substrates such as $SrTiO_3(001)$ or MgO(001) using seed layers formed from a variety of materials but preferably Cr or Pt[7,8]. Such single crystalline substrates are not useful for MRAM applications in which the MTJs must be deposited on wires formed from polycrystalline copper, which may be covered with other layers that are also polycrystalline or amorphous. Here it is shown that thin films of ferrimagnetic $Mn_3Ge$ with giant PMA can be grown on amorphous substrates ($Si(001)/SiO_2$) using underlayers formed from TaN/$IrMn_3$ (TI). The magnetic properties of these films are comparable or superior to films grown under similar conditions on single crystal MgO(001) substrates using epitaxial Cr(001) underlayers.

Highly textured, polycrystalline and tetragonal $Mn_3Ge$ films were grown by either ion-beam deposition (IBD) or dc-magnetron sputtering in an ultra-high vacuum (UHV) chamber with a base pressure of $\sim 4\times 10^{-10}$ Torr on Si(001) substrates covered with 250 Å of amorphous $SiO_2$. Seed layers formed from bilayers of TaN/IrMn$_3$ that are first deposited on the SiO$_2$ induce (001) textured Mn$_3$Ge films that are tetragonally distorted. IrMn$_3$ is known to have a L1$_2$ structure, which is cubic and matches one of the sub-lattices of the structure that Mn$_3$Ge is known to form. Moreover, the lattice mismatch between IrMn$_3$ and Mn$_3$Ge is less than 1%. The TaN layer, which is grown by reactive sputtering, promotes the growth of (001) textured IrMn$_3$, since fcc-IrMn$_3$ favors the (111) out-of-plane orientation when grown directly on the amorphous SiO$_2$ surface. However, in contrast to theoretical predictions of giant values of TMR[6,9] for MTJs using Mn$_3$Ge electrodes, much smaller values are found experimentally, which are attributed to compensation in the tunneling spin current polarization from atomic layer variations of the electrode surface termination at the tunnel barrier interface. It is suggested herein that this is a consequence of ferrimagnets with layer-by-layer alternation of magnetization, when the tunneling spin polarization of these layers compensates each other. This hypothesis was confirmed by preparing MTJs using another ferri-magnetic Heusler compound, Mn$_2$CuSb, which also shows high PMA but yet very small TMR.

The structural and magnetic properties of a Mn$_3$Ge film depend sensitively on its composition and atomic order. The latter is strongly influenced by the deposition temperature and subsequent anneal conditions, which also affect the smoothness of the Mn$_3$Ge film. In order to achieve optimal MTJ performance the electrode must be atomically smooth. The root mean square (rms) roughness of the Mn$_3$Ge film, $r_{rms}$, measured using atomic force microscopy (AFM), is found to increase significantly when the growth temperature ($T_G$) exceeds modest temperatures of just ~200° C., but higher growth temperatures are needed to sustain the Heusler structure, as measured from x-ray diffraction. Thus, an optimal growth method includes a 3-step process for the Mn$_3$Ge electrode, in which an initial 20 Å Mn$_3$Ge layer is grown at 450° C., followed by a thicker Mn$_3$Ge layer deposited at $T_G$=150° C., with a final in-situ anneal at 450° C. for 1-2 h in vacuum, thereby giving smooth films ($r_{rms}$~3 Å) with high PMA. During the annealing step of Mn$_3$Ge films, there is substantial inter-diffusion between the IrMn$_3$ and Mn$_3$Ge layers, which causes deterioration of the magnetic properties of Mn$_3$Ge. This inter-diffusion was prevented by using a thin 10-20 Å TaN barrier between IrMn$_3$ and Mn$_3$Ge layers, as revealed by electron energy loss spectroscopy (EELS) measurements. Thus, the preferred underlayer is formed from TaN/IrMn$_3$/TaN (TIT). On the other hand, a single TaN underlayer was found to give much poorer quality Mn$_3$Ge layers.

FIG. 1 compares the magnetic properties of Mn$_3$Ge films of varying thicknesses grown on amorphous substrates using the aforementioned 3-step process and on a crystalline MgO(001) substrate with a Cr seed layer (MC). Excellent PMA is observed in all cases but the highest coercive and anisotropy fields are found for structures grown on the TIT underlayer. Coercive fields of 6 T and anisotropy fields exceeding 7 T are found. FIG. 1C summarizes the magnetic moment m, coercivity H$_C$, and uniaxial magnetic anisotropy K$_U$ for these films. Values of m for Mn$_3$Ge films grown on TIT underlayers are close to those theoretically predicted for bulk Mn$_3$Ge[10], but m is significantly lower by ~15-35% for Mn$_3$Ge films grown using TI underlayers or a MC single crystal substrate. For the latter film, the magnetic anisotropy K$_U$ is substantially lower, which is attributed to the large lattice mismatch (~7%) between Cr and Mn$_3$Ge.

Figure 1B:
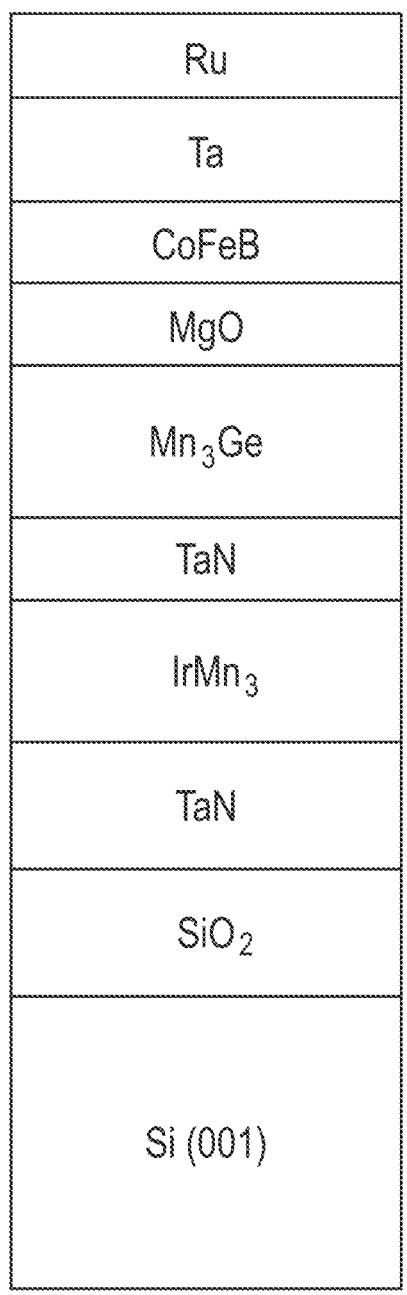
Figure 1C:
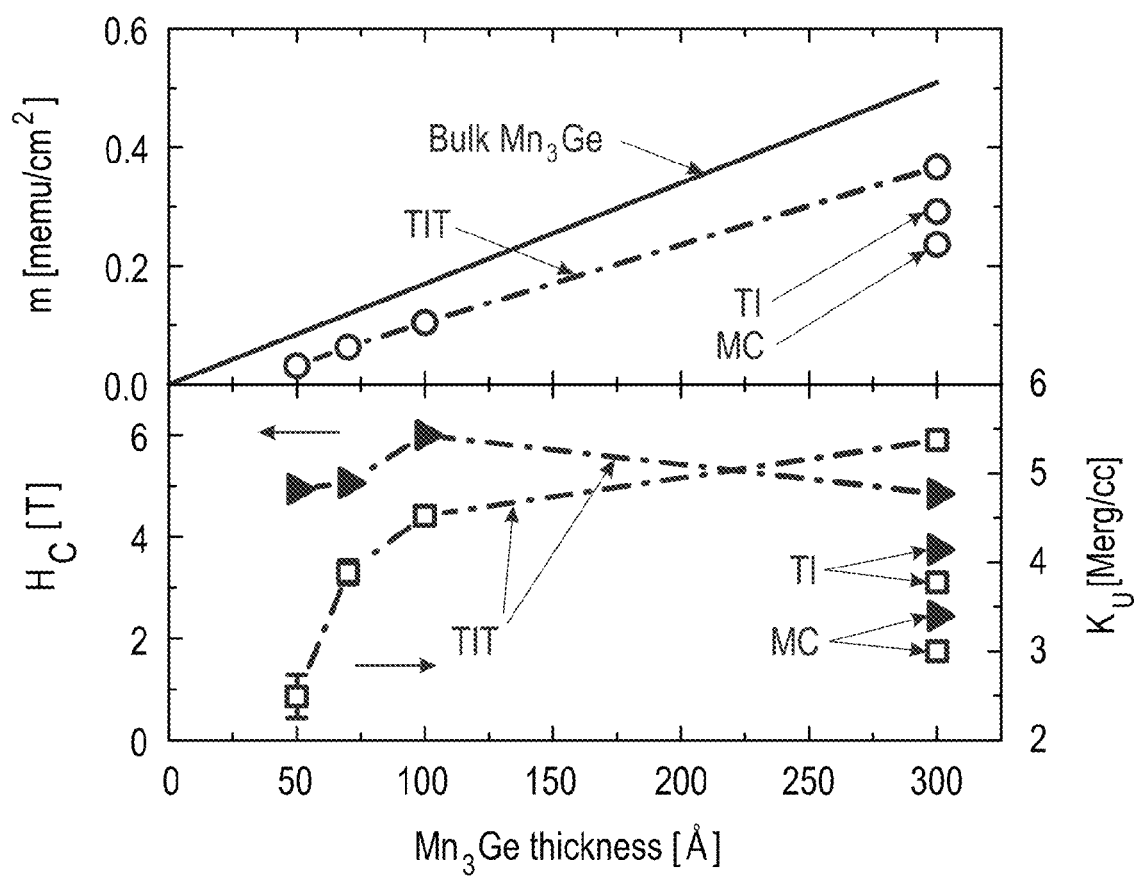
Figure 1D:
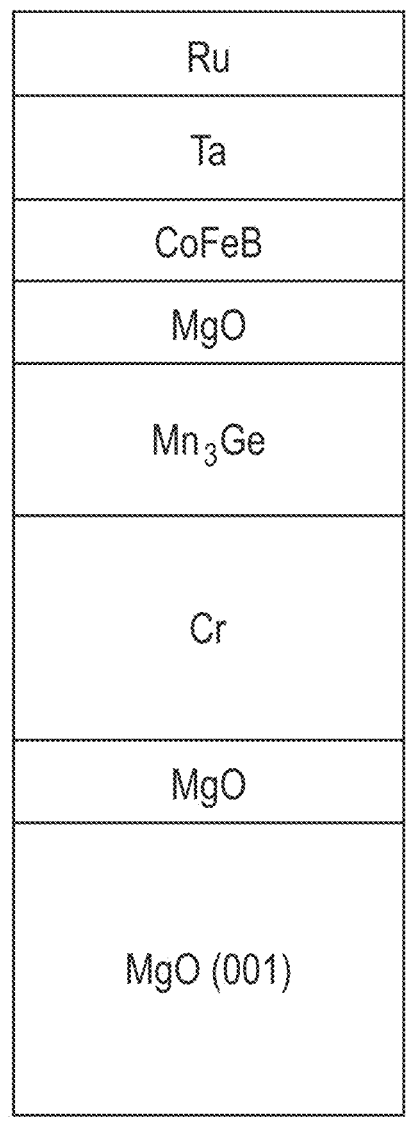

MTJ devices were fabricated using standard lithographic techniques from film stacks whose structures are illustrated in FIG. 1B. The reference electrode was formed from the Mn$_3$Ge Heusler compound, and the free electrode from an ultrathin layer of CoFeB having a composition of 20:60:20. Before patterning, these films were post-annealed at 350° C. for 60 minutes in a high-vacuum chamber using an applied magnetic field of 1 T directed out of the plane of the sample. Devices with sizes of 1×2 µm$^2$ and ~30 nm in diameter were fabricated by optical lithography and e-beam lithography, respectively. Only the free layer was patterned to define the junction size, while the reference layer was not patterned.

Figure 2A:
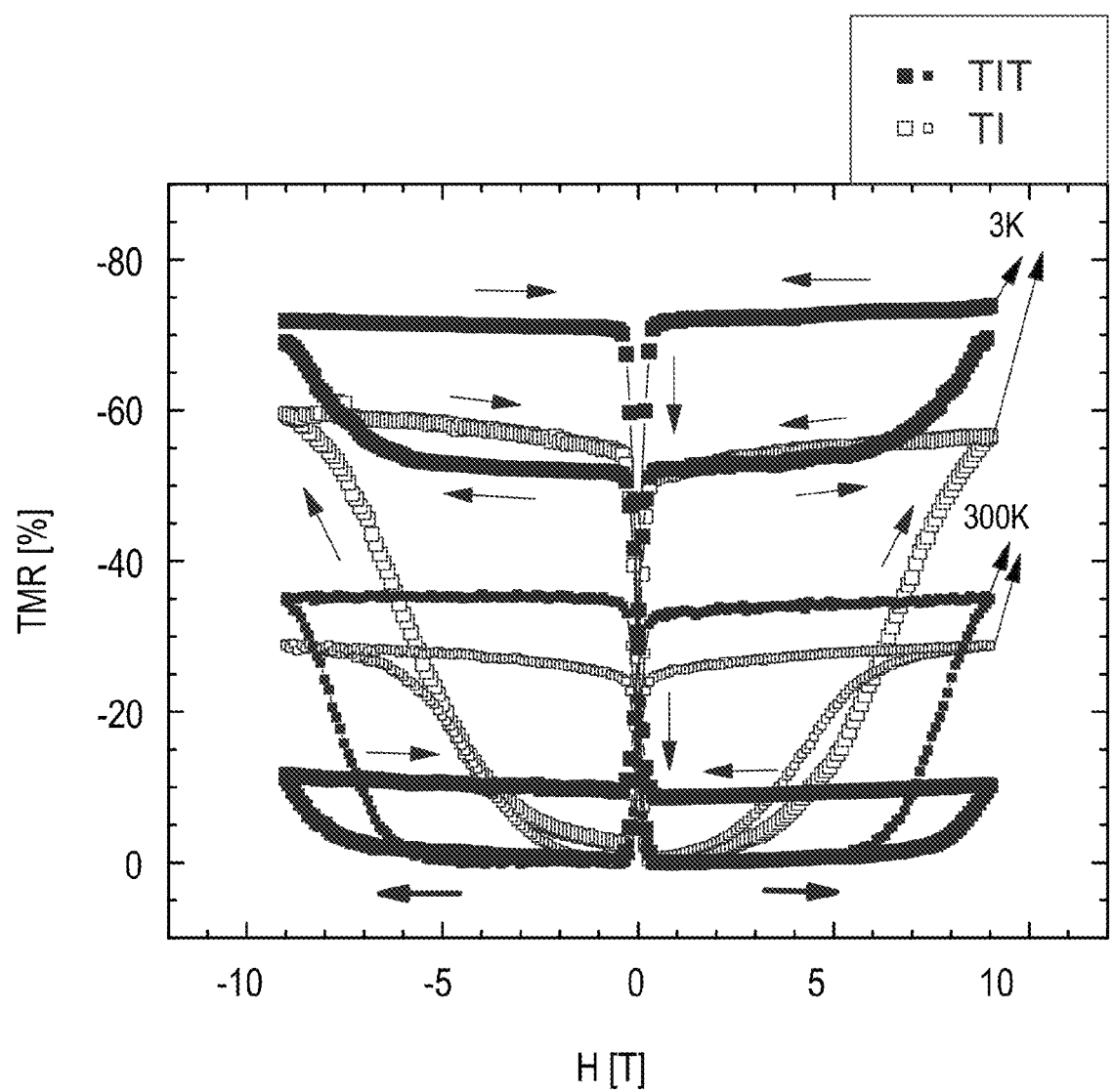
FIGS. 2A, 2B, 2C, and 2D. Characteristics of $Mn_3Ge$-Based Magnetic Tunnel Junctions FIG. 2A TMR vs. H (perpendicular to the device) measured at 300 K (smaller squares) and 3 K (larger squares) for MTJ devices grown using TI (open squares) and TIT (solid squares) underlayers. For the TIT junction, two sets of data were measured at 3 K (larger squares) after cooling down the device from 300 K in a magnetic field of +9 T and −9 T, respectively. These data are mirror images of each other, as can be seen in the figure. All the other measurements were performed without field-cooling.

FIG. 2A compares TMR versus perpendicular magnetic field measured at 300 K and 3 K for patterned MTJ devices (1×2 µm$^2$) using TI and TIT underlayers. In each case high applied magnetic fields (±9 T) are needed to align the magnetic moments of the Mn$_3$Ge and CoFeB layers parallel to each other (P state) because of the giant uniaxial anisotropy of Mn$_3$Ge. The junction resistance is higher in the P state compared to the antiparallel (AP) state, obtained when the CoFeB moment switches close to zero field. Thus, the TMR ($[(R_{AP}-R_P)/R_{AP}]\times 100$) is negative with values of ~−35% at 300 K and ~−74% at 3 K, where $R_P$ and $R_{AP}$ are the junction resistances in the P and AP states, respectively. These are the highest values of TMR reported to date in perpendicularly-magnetized MTJ devices using a tetragonally distorted Heusler compound as a magnetic electrode. Nonetheless, these values are much smaller than those predicted by density functional theory (DFT) calculations, as discussed below.

Figure 2B:
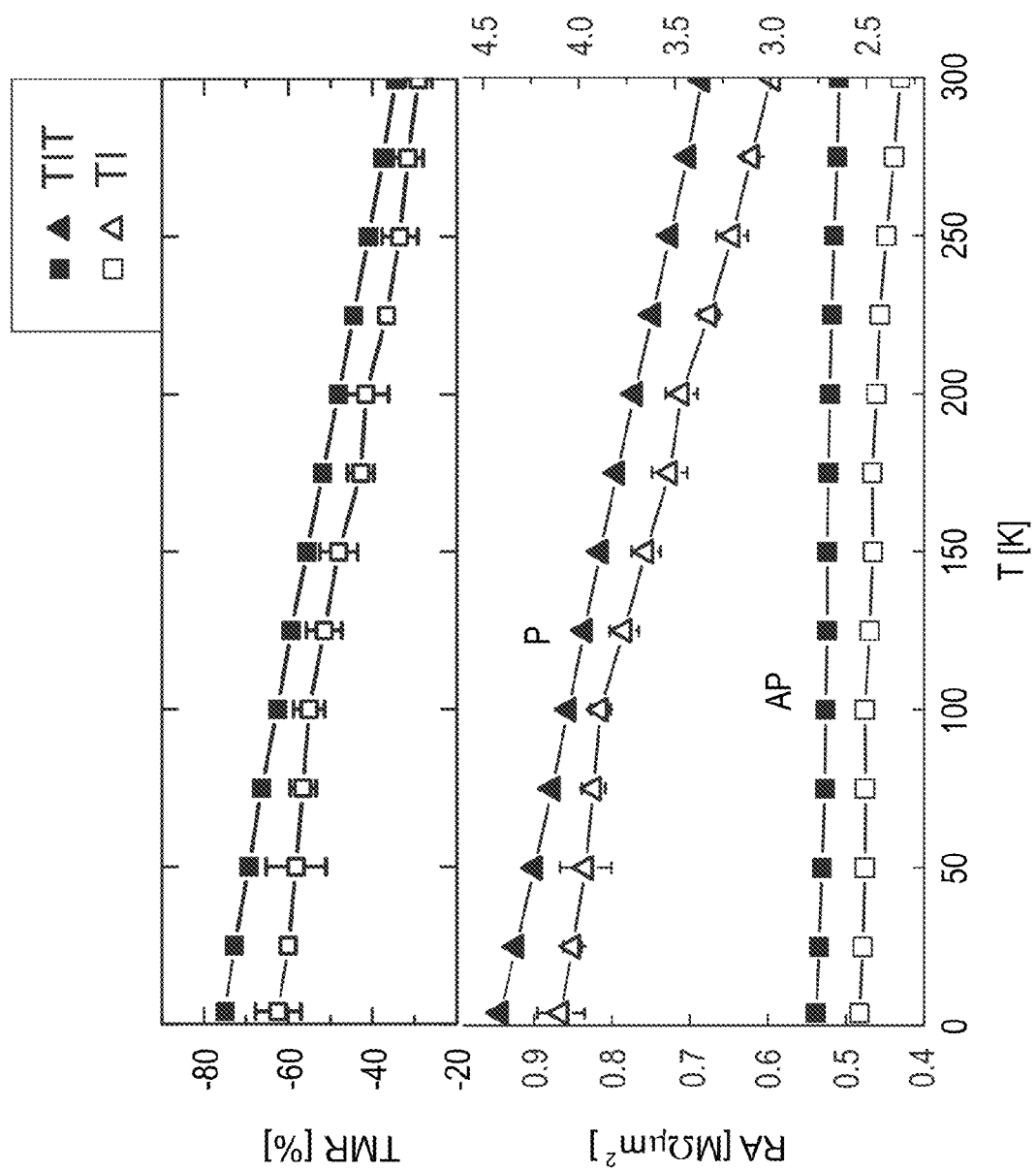
Figure 2C:
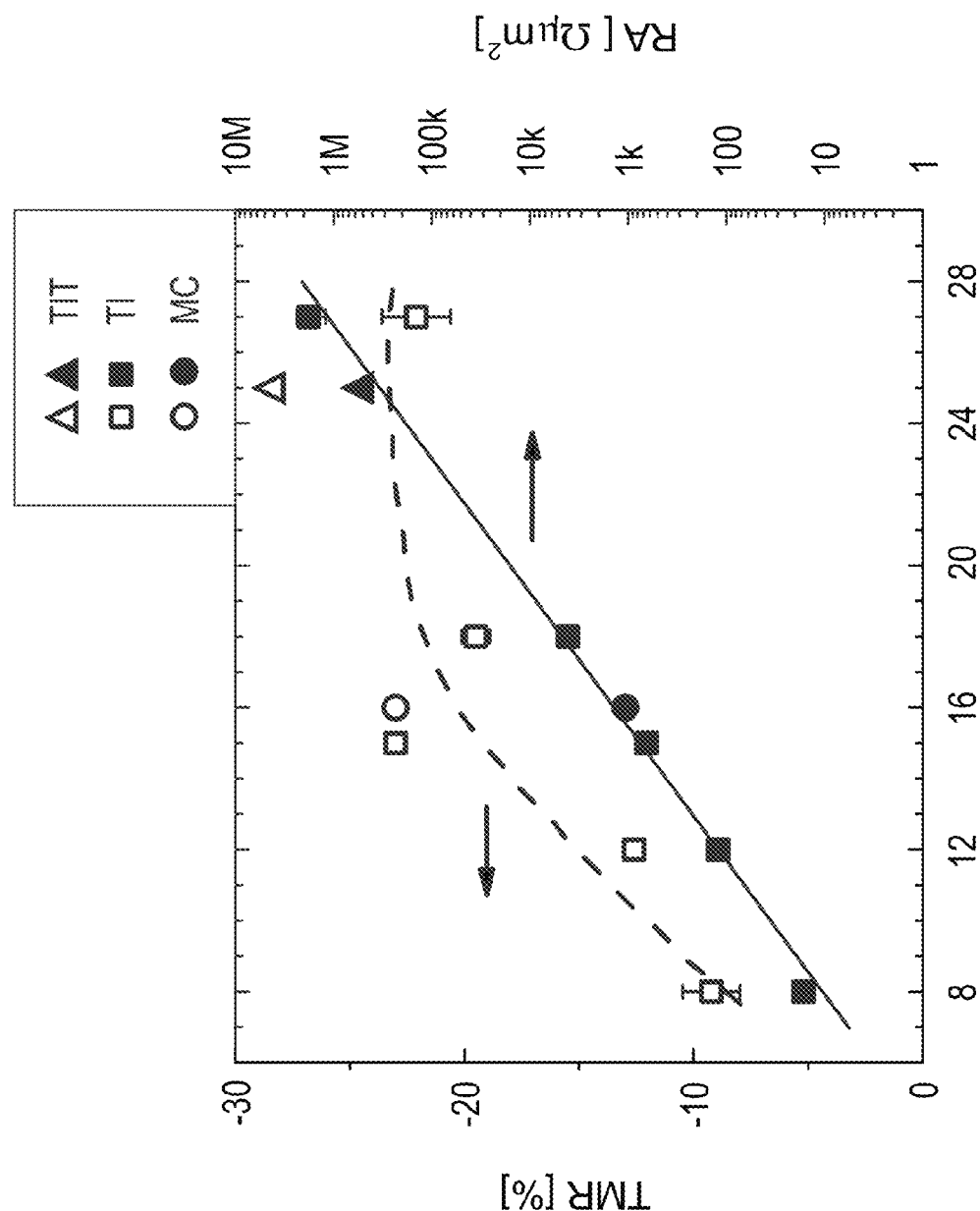
Figure 2D:
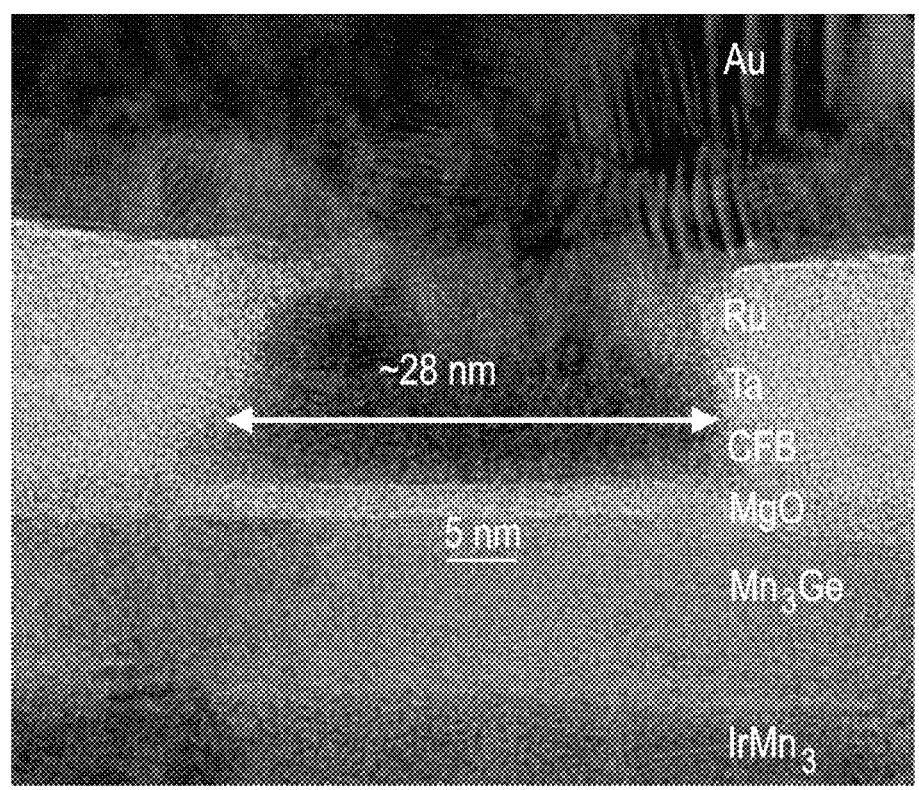

For a given MTJ device $R_{AP}$ barely changes, while $R_P$ increases monotonically as T decreases, resulting in higher TMR at low temperatures (FIG. 2B). These properties as well as the dependence of the resistance-area product $R_{AP}A$ and TMR on the barrier thickness (FIG. 2C) are characteristic of a high quality tunnel barrier. A cross-sectional high-resolution transmission electron microscopy (HRTEM) image of a typical MTJ device with a width of 27 nm, shown in FIG. 2D, illustrates the high quality of the structure and the device patterning.

Notwithstanding the exceptionally high PMA values exhibited by polycrystalline Mn$_3$Ge films, the surprisingly low TMR values lessen their potential importance for MTJ devices. As discussed below, this is attributed to their ferrimagnetic structure. This limitation could be overcome by identifying Heusler compounds which display high PMA and which are ferromagnetic.

To identify potential candidate tetragonal materials, computational materials discovery methods were used to calculate the structure and electronic properties of several hundred Heusler compounds (with X=Mn, Fe, Co, Ni, Cu, Ru, Rh, Pd; Y=Sc, Mn, Fe, Co, Ni, Cu, Ru, Rh, Pd, Os, Ir, Pt; and Z=Al, Si, Ga, Ge, In, Sn, Sb) for both the regular and inverse structures and for ferri- and ferro-magnetic configurations. Surprisingly, approximately 40% of these compounds are calculated to be tetragonal in their ground state. By rank ordering these tetragonal compounds according to the combination of the energy difference between the tetragonal and cubic structures and that between the inverse and regular structures, about 30 possible candidate tetragonal materials were identified, in which the average energy difference exceeded ~0.3 eV per formula unit. For each of these, a 8 in thin film form was prepared using the same buffer layers and deposition conditions discussed above. Half of these compounds showed a tetragonal structure and two showed excellent PMA properties, namely, Mn$_2$CuSb and Rh$_2$CoSb. In the other cases, we speculate that the theoretical predictions were not borne out due to atomic disorder on the X and Y sites. This is especially true when X and Y have similar chemical properties or atomic size.

Similar magnetic properties were found for $Mn_2CuSb$ and $Rh_2CoSb$ films grown using either TI underlayers or an MC crystalline substrate, but the latter films were typically smoother and better suited for MTJ studies. Results are shown in FIG. 3 for $Mn_2CuSb$. Square magnetic hysteresis loops consistent with PMA are found. The calculated lowest energy configuration of $Mn_2CuSb$ is a tetragonal ferromagnetic regular Heusler with a moment of 5.4 μB per formula unit (see Table 1). Although the deposited films are tetragonal, in agreement with the calculations, the measured c/a ratio is much smaller in the films ($c_t/\sqrt{2}a_t$~1.1) than that predicted for a fully ordered $Mn_2CuSb$ bulk compound ($c_t/\sqrt{2}a_t$~1.4), and thus only slightly distorted from the cubic phase. Moreover, the magnetization of the films is much too low (~0.4 μB per formula unit) to be consistent with the predicted ferromagnetic state, as is the TMR, as discussed below. These findings can be explained by the likelihood of chemical disorder within the deposited films. Note that the calculations predict that, for the cubic phase, the structure will be the inverse structure with a ferrimagnetic ordering, with a low moment (see Table 1).

Figure 3A:
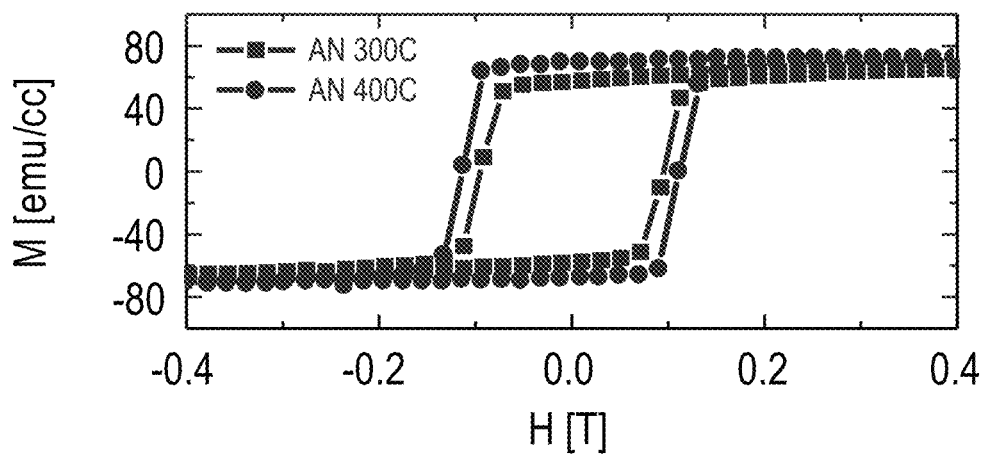
FIGS. 3A, 3B, 3C, and 3D. Magnetics and TMR Properties of $Mn_2CuSb$ Hensler Alloy.
Figure 3B:
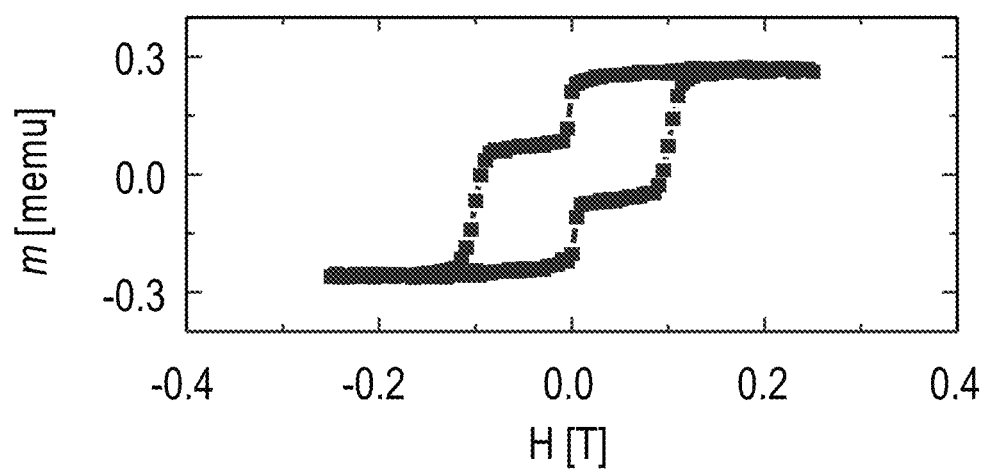
Figure 3C:
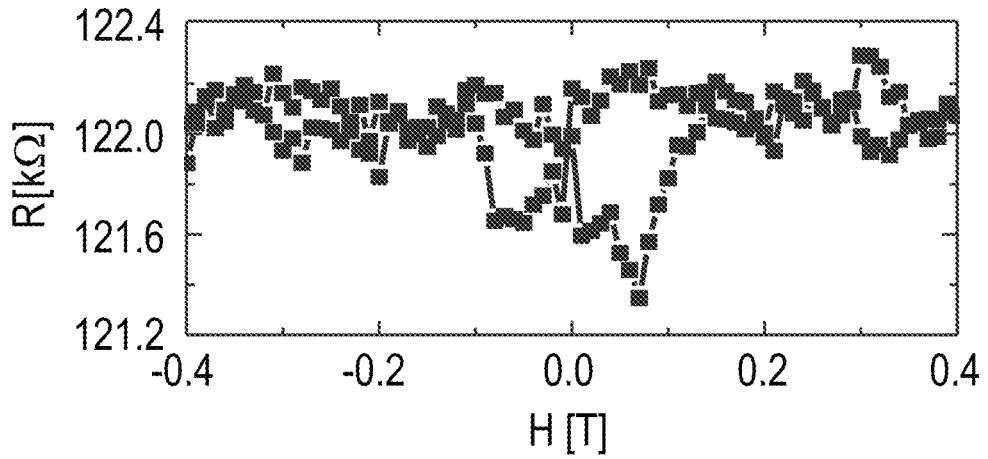
Figure 3D:
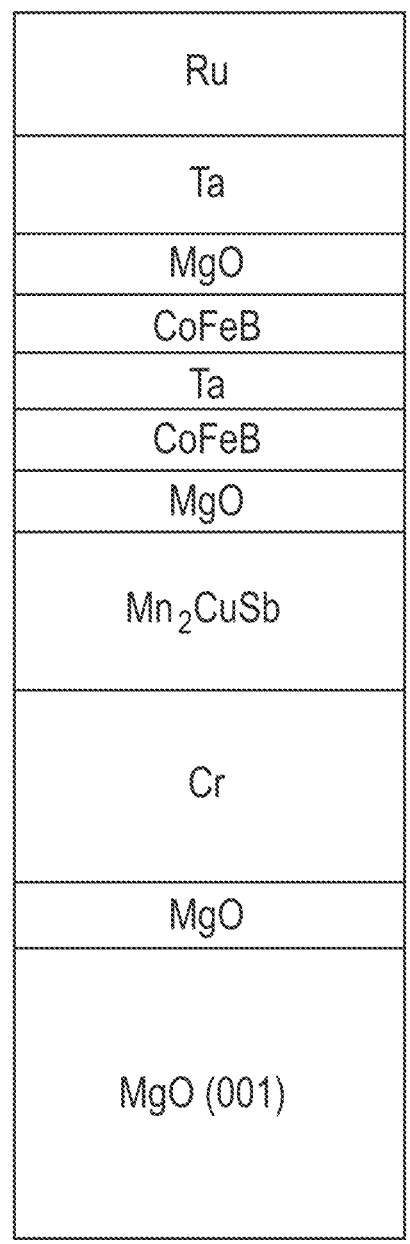

MTJ devices were prepared from $Mn_2CuSb$ films with the layer stack shown in FIG. 3D and the magnetic hysteresis loop shown in FIG. 3B. The latter shows clear independent switching of the free layer (CoFeB) and the reference layer ($Mn_2CuSb$), but TMR curves measured on 1×2 μm² size devices show only very small TMR values of ~−1% (FIG. 3C).

Figure 4A:
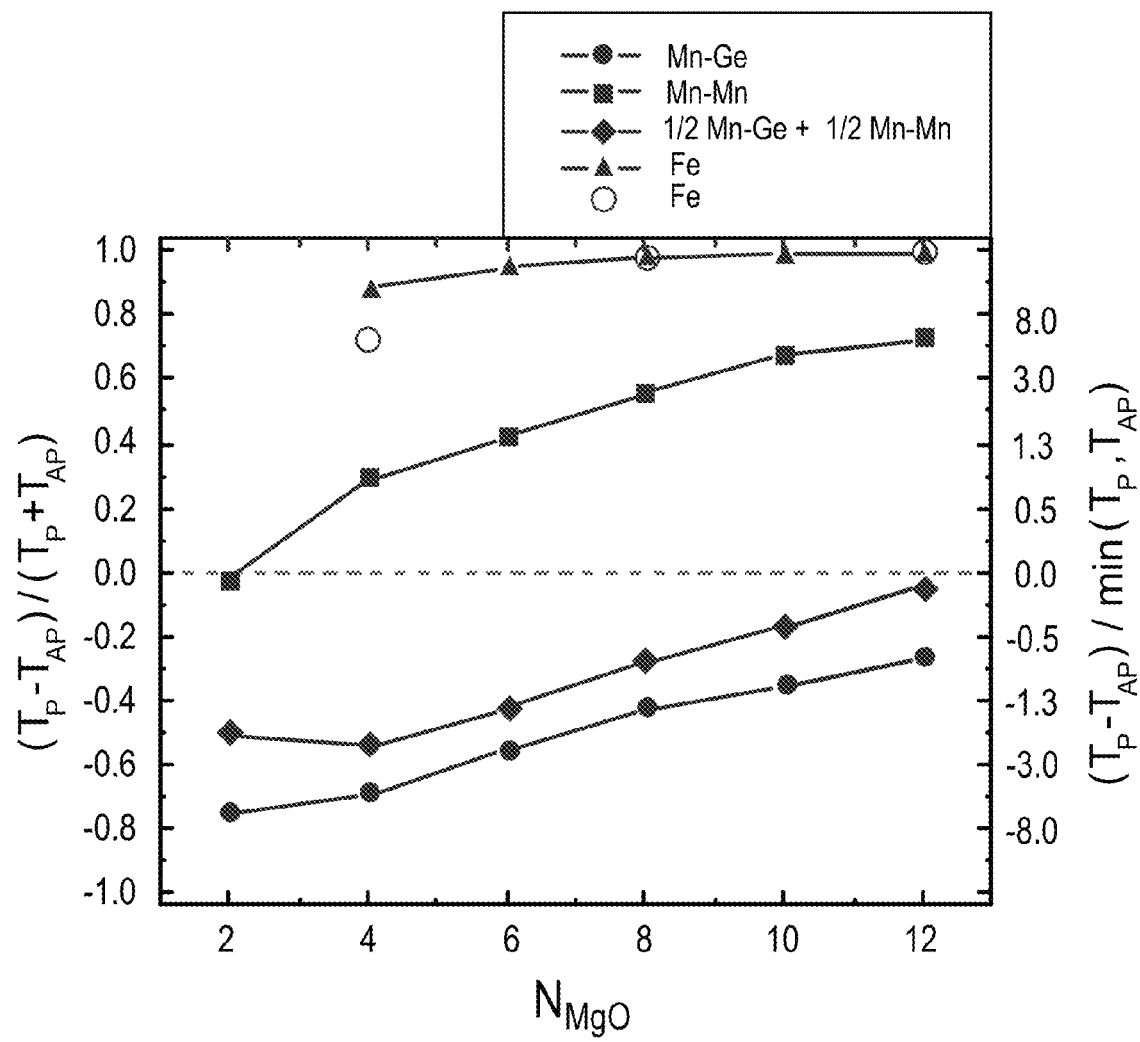
FIGS. 4A, 4B, 4C, and 4D. TMR Theoretical Calculations for $Mn_3Ge$/MgO/Fe, Fe/MgO/Fe, and $Mn_2CuSb$/MgO/Fe Tunnel Junctions.

Ab initio calculations of the electronic structure and transport properties of $Mn_3Ge/MgO/Fe$ and $Mn_2CuSb/MgO/Fe$ MTJs were performed (see below for details of the calculations). Note that bcc Fe was used rather than CoFeB as in the experiments, in order to simplify the calculations. The TMR for $Mn_3Ge/MgO/Fe$ MTJs is shown in FIG. 4A as a function of the number of MgO layers, $N_{MgO}$. Two definitions of TMR are shown: $(T_P-T_{AP})/\min(T_P,T_{AP})$, which can vary from $-\infty$ to $\infty$ (this is used for the experimental data) and $(T_P-T_{AP})/(T_P+T_{AP})$, which can vary from −1 to 1. Here $T_P$ and $T_P$ are the transmission functions (calculated at zero bias voltage) corresponding to the P and AP states, respectively. The most important result is that the TMR depends sensitively on the atomic configuration of the termination layer in the $Mn_3Ge$ adjacent to the MgO tunnel barrier. The TMR has opposite signs for the two termination layers, Mn—Mn and Mn—Ge, increasing in magnitude with $N_{MgO}$ for Mn—Mn but decreasing in magnitude for Mn—Ge. These results can be understood from the layer dependent spin-dependent density of states calculated for the bulk electronic structure of $Mn_3Ge$, and the well understood symmetry spin-filtering properties of the MgO/Fe interface. The spin polarization of the native termination layers is negative in both cases but much higher for Mn—Ge. A Brillouin zone (BZ) filtering effect[11] arising from the $Mn_3Ge/MgO$ interface tends to make the TMR positive for both terminations as the MgO layer thickness is increased. Thus, resultant tunneling spin polarization (TSP), the spin polarization of electrons which tunnel through the barrier, and the TMR is negative for Mn—Ge, but positive for Mn—Mn for intermediate MgO thicknesses of experimental interest. The balance between the native spin polarization and the BZ filtering accounts for the dependence of the TMR on $N_{MgO}$ and the termination layer.

Figure 4B:
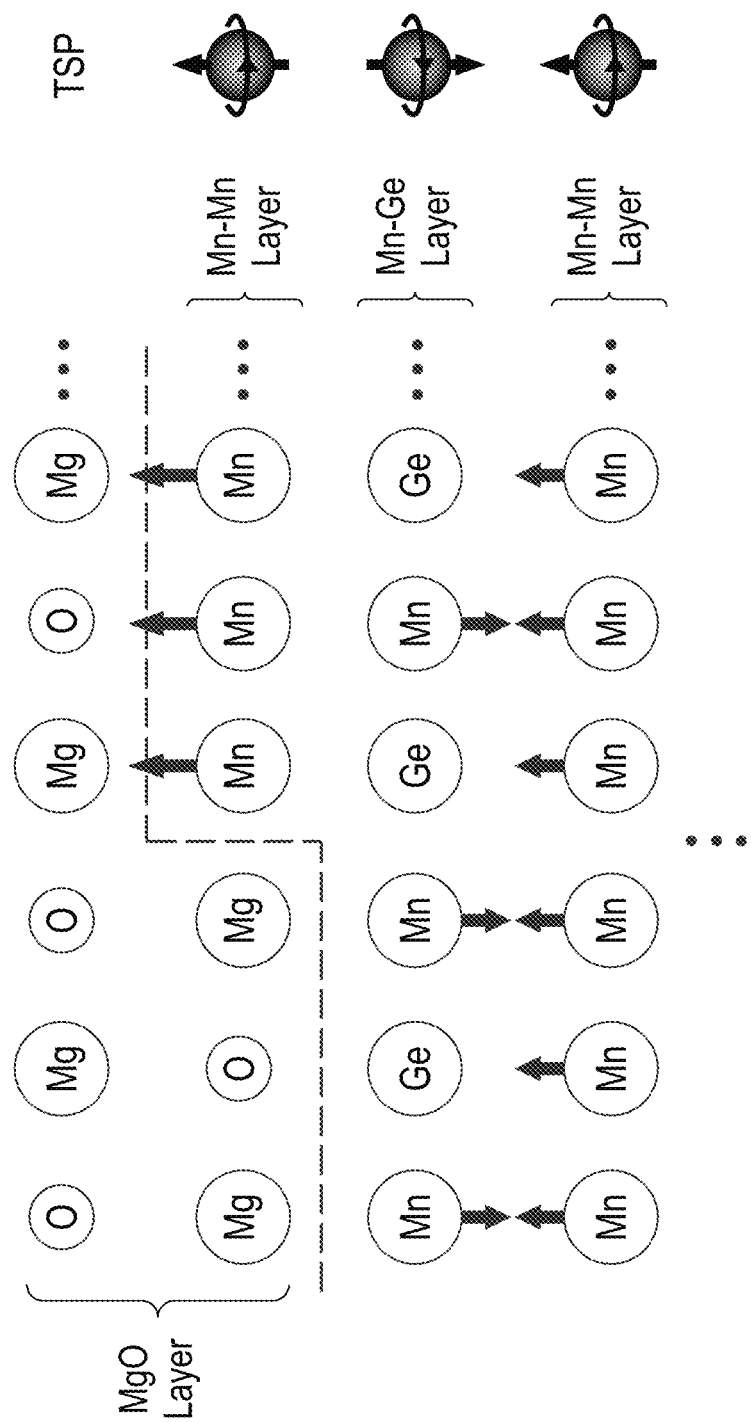

These calculations give a natural explanation for the low TMR values found experimentally using $Mn_3Ge$ electrodes. Even though the $Mn_3Ge/MgO$ interface is very smooth (FIG. 2D), inevitably there will be atomic scale fluctuations in the morphology of the $Mn_3Ge$ layer that gives rise to regions with Mn—Mn and Mn—Ge terminations, due to the fundamental underlying structure of the Heusler compound (see illustration in FIG. 4B). The simplest way to model such fluctuations is to average the transmission functions over the different terminations (separately for P and AP states), assuming that the MgO thickness is the same across the device. The TMR calculated from this simple model with an assumption of equal areas occupied by Mn—Ge and Mn—Mn terminations is shown in FIG. 4A. The calculations give a negative TMR since both $T_P$ and $T_{AP}$ for the Mn—Ge termination are larger than those for the Mn—Mn termination (for all $N_{MgO}$ considered—ranging from 2 to 12). The negative TMR is consistent with the experimental measurements. Note that due to the large 10.5% lattice mismatch between MgO and $Mn_3Ge$, the BZ filtering effect, which critically depends on the existence of the well-defined 2D Brillouin zone of the $Mn_3Ge/MgO$ interface, is likely more suppressed in actual devices as compared to the large negative spin polarization effect, which is less sensitive to the existence of the 2D BZ. Thus, both 'ideal crystal' theoretical simulations (FIG. 4A) and non-ideal crystal arguments predict negative TMR for the $Mn_3Ge/MgO/Fe$ system, in agreement with experimental results. Moreover, the low temperature TMR value of −75% found experimentally (~27 Å thick MgO: FIG. 2B) is in surprisingly good agreement with that calculated for the Mn—Ge termination with $N_{MgO}$=12, assuming no contribution to the TMR from the regions with Mn—Mn termination.

TABLE I

Calculated by DFT-based VASP[12] program total energy, $E_{tot}$, lattice parameters and magnetic moments for different configurations of $Mn_2CuSb$ Heusler alloy (T = 0 K).

| Heusler structure | Coupling of the magnetic moments of two Mn atoms | $E_{tot}$ in cubic phase (eV) | Lattice constant $a_c$ in cubic phase (Å) | Magnetic moment in cubic phase (μ$_B$) | $E_{tot}$ in tetragonal phase (eV) | Lattice constant $a_t$ in tetragonal phase (Å) | Lattice constant $c_t$ in tetragonal phase (Å) | Magnetic moment in tetragonal phase (μ$_B$) |
|---|---|---|---|---|---|---|---|---|
| Regular | ferro | −25.111 | 6.23 | 6.4 | −25.569 | 3.86 | 7.80 | 5.4 |
| Regular | ferri | −25.107 | 6.28 | 0 | | | | |
| Inverse | ferro | −24.840 | 6.12 | 4.3 | −25.292 | 3.83 | 8.19 | 6.1 |
| Inverse | ferri | −25.176 | 6.22 | 1.0 | −25.272 | 3.95 | 7.82 | 0.4 |

Figure 4C:
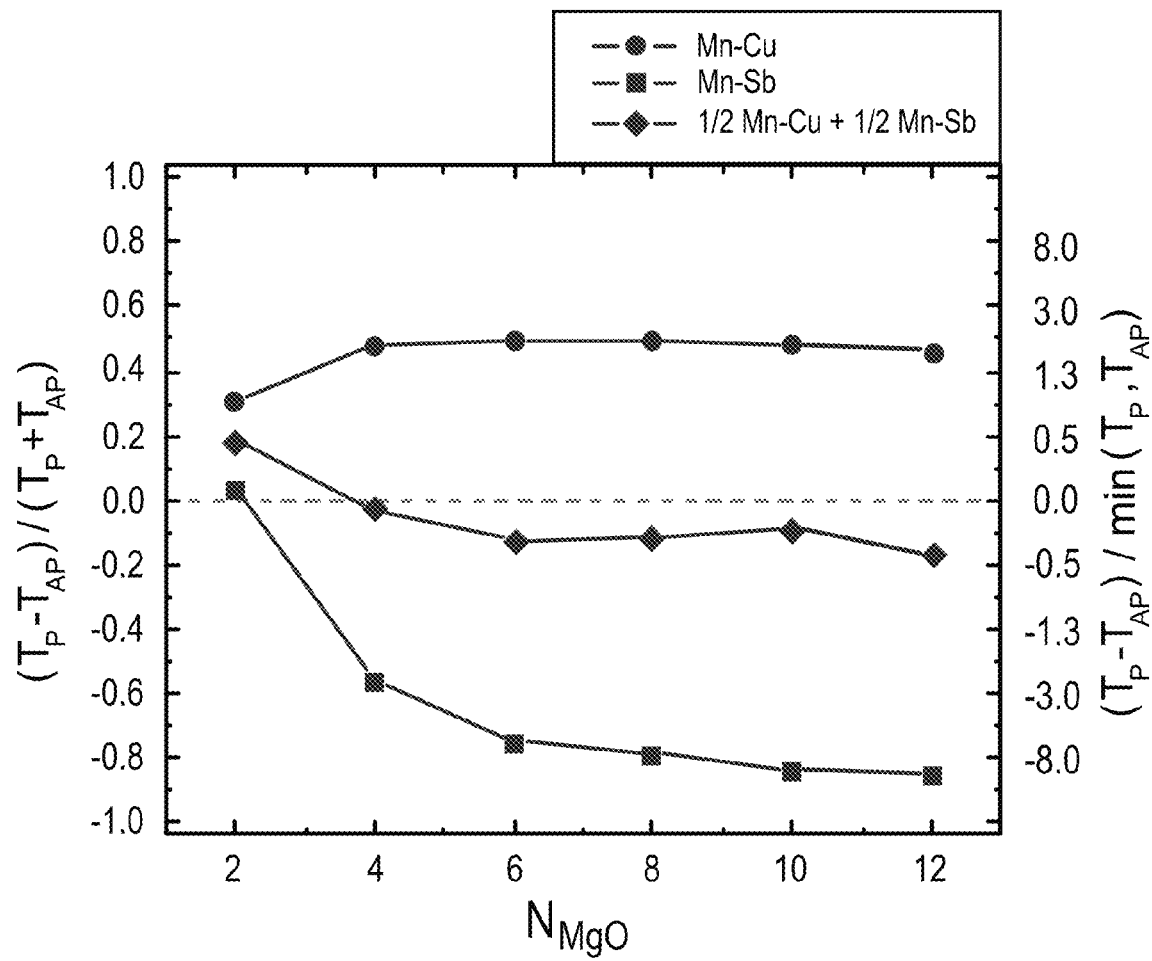
Figure 4D:
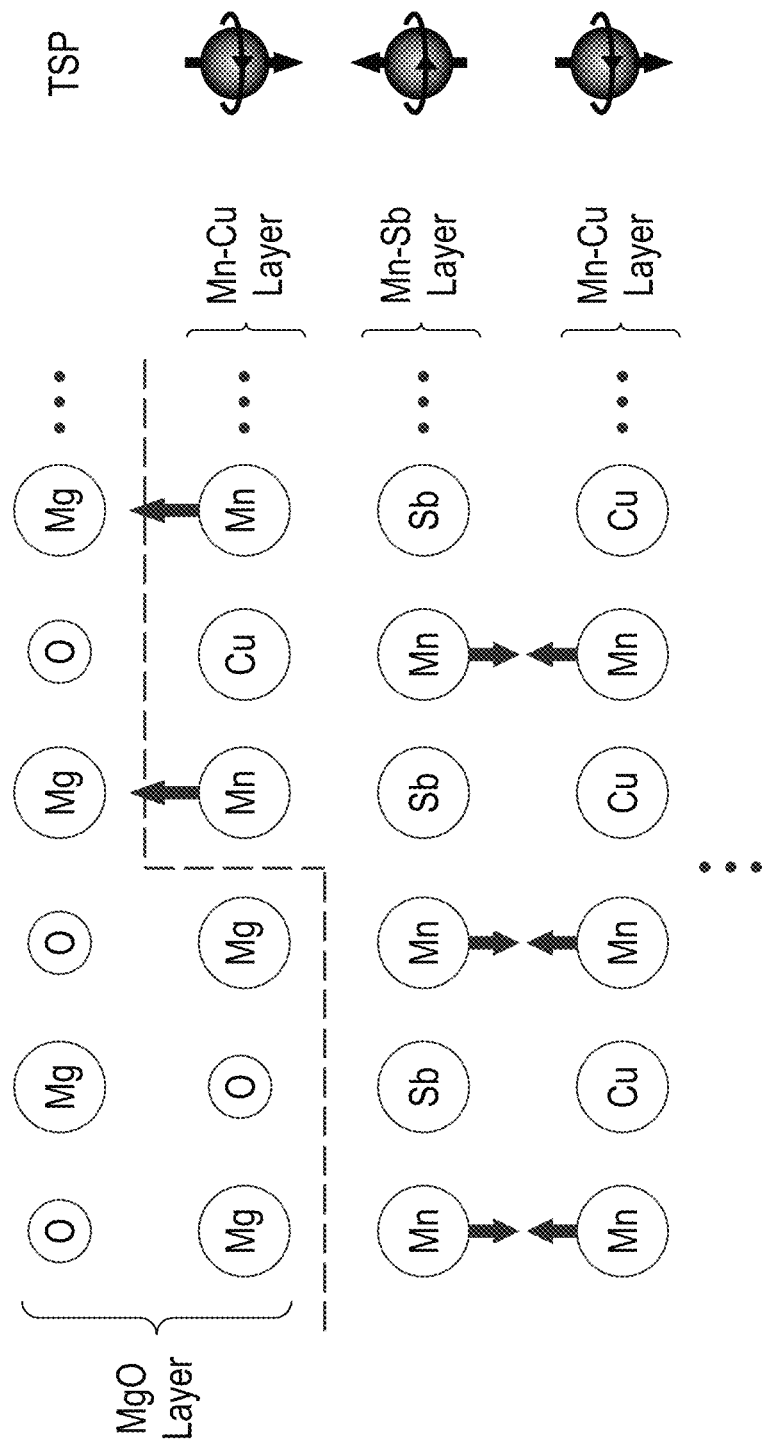

The calculated TMR versus $N_{MgO}$ for $Mn_2CuSb/MgO/Fe$ MTJs with Mn—Sb and Mn—Cu terminations at the MgO interface are compared in FIG. 4C. The calculated magnetic moment of the Mn—Sb layer (3.2μ$_B$) is larger than that for the Mn—Cu layer (−2.8μ$_B$). Interestingly, the native spin polarization of the termination layers is of the opposite sign of the magnetic moment direction of these layers, whereas for Mn$_3$Ge the native spin polarization is negative for both terminations. Moreover, there is no significant BZ filtering effect for Mn$_2$CuSb/MgO. In this case the dependence of the TMR on N$_{MgO}$ is due to the symmetry spin filtering effect from MgO/Fe, as can be seen from FIG. 4C by comparing the calculated TMR for Mn$_2$CuSb/MgO/Fe, for both terminations. For the Mn$_2$CuSb/MgO/Fe MTJ, a negative TMR is predicted for the termination layer with the largest magnetic moment (Mn—Sb), whereas for Mn$_3$Ge/MgO/Fe the opposite is the case. The TMR calculated for an MTJ with equal areas of Mn—Cu and Mn—Sb terminations is shown in FIG. 4C. The resulting TMR is significantly reduced due to the cancellation of contributions from the different terminations and has an overall negative sign (for N$_{MgO}$>2). The negative sign of TMR and its small value agrees with the experimental findings.

In summary, highly textured ferrimagnetic Heusler films with large perpendicular anisotropy have been grown on amorphous substrates, thereby opening a path to their potential use for many applications such as magnetic recording media and rare-earth free hard magnets. However, the TMR is strongly influenced by unavoidable atomic steps at the tunnel barrier interface. When the two termination layers have opposite tunneling spin polarizations they compensate one another leading to low TMR, as is the case for both Mn$_3$Ge and Mn$_2$CuSb. However, the tunneling spin polarization can be aligned either parallel, as in the case of Mn$_3$Ge, or anti-parallel, as in the case of Mn$_2$CuSb, to the magnetization of the termination layers. In conclusion, the most interesting and technologically useful ferrimagnetic Heusler material will have termination layers with the same sign of the tunneling spin polarization, i.e., for one termination layer the tunneling spin polarization is parallel to the magnetization, and for the other it is the opposite. Such technologically promising materials have been identified by the use of computational techniques and are listed below in Table II.

TABLE II

Figure 5:
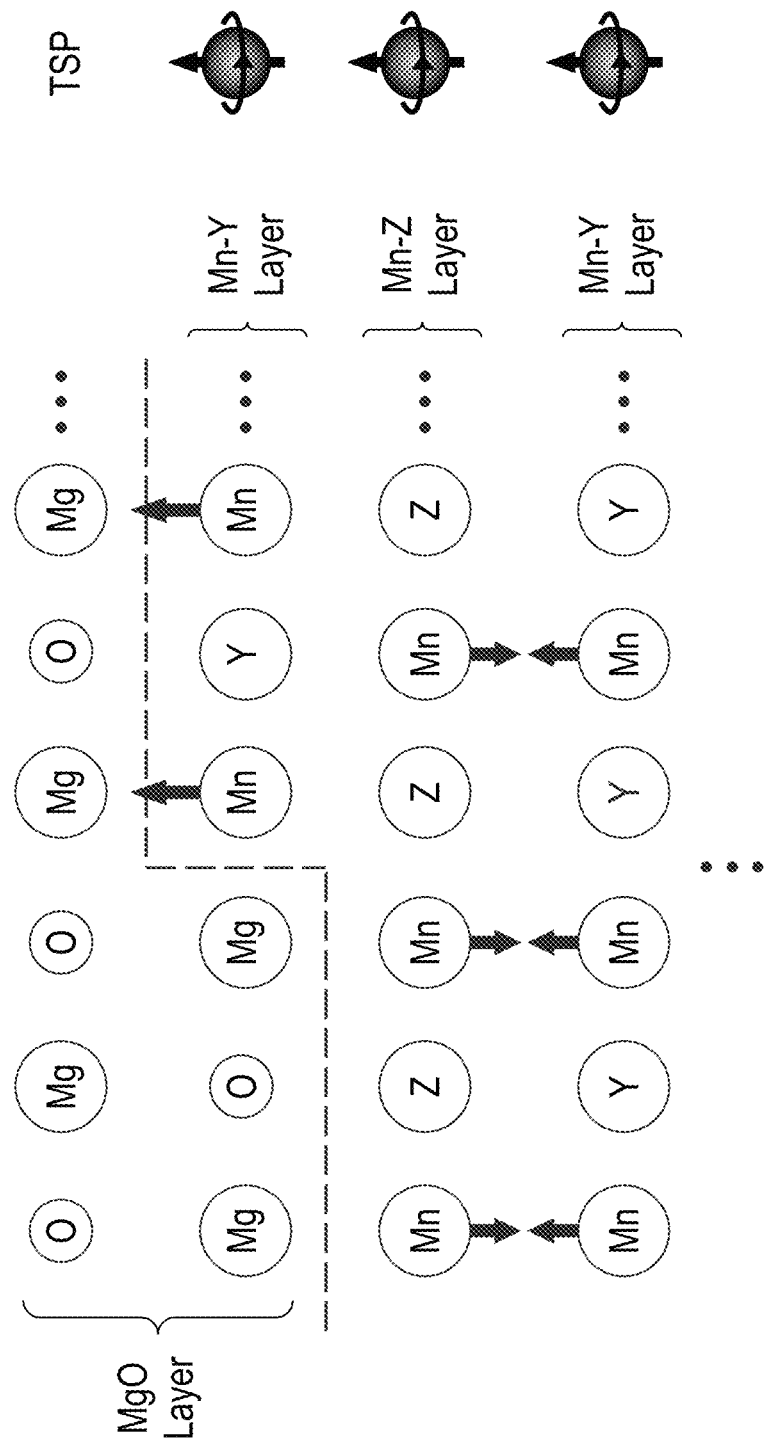
FIG. 5 Schematic of atomic step between two distinct terminations with opposite magnetic moments for a typical Heusler alloy of the type $Mn_2YZ$. Depending on the choices of element Y and Z, the sign of tunneling spin polarization for the Mn—Y and the Mn—Z layer could be the same. The tunneling spin polarization of each layer is shown on the right.

List of tetragonal ferrimagnetic Heusler alloys predicted to have same sign of native spin polarization for each termination layer and same sign of BZ filtering effect and total native spin polarization. Total spin polarization and spin polarization of the two distinct termination layers (Mn-Y and Mn-Z layer) are also included. Mn$_3$Ge and Mn$_2$CuSb are also included here for comparison. Some of them, marked as bold, show high spin polarization (>0.7) and/or BZ filtering effect. FIG. 5 illustrates the Mn-Y and Mn-Z terminations for Heuslers of the type Mn$_2$YZ.

| Heusler | BZ filtering Is there any BZ filtering with MgO? | BZ filtering Is sign of BZ filtenng AND spin pol. the same? | spin pol. total | spin pol. Mn-Y layer | spin pol. Mn-Z layer |
|---|---|---|---|---|---|
| Mn$_3$Ge | yes | No | −0.72 | −0.76 | −0.63 |
| Mn$_2$CuSb | no | N/A | 0.10 | 0.43 | −0.36 |
| Mn$_2$CoGe | no | N/A | 0.77 | 0.85 | 0.50 |
| Mn$_2$CoSn | yes | Yes | 0.89 | 0.93 | 0.69 |
| Mn$_2$NiGa | yes | Yes | 0.67 | 0.71 | 0.55 |
| Mn$_2$WSb | yes | Yes | 0.48 | 0.43 | 0.59 |
| Mn$_2$OsSn | no | N/A | −0.91 | −0.95 | −0.77 |
| Mn$_2$IrIn | no | N/A | 0.80 | 0.91 | 0.47 |
| Mn$_2$MoSb | yes | Yes | 0.47 | 0.43 | 0.59 |
| Mn$_2$RuSn | no | N/A | −0.92 | −0.96 | −0.78 |
| Mn$_3$Sb | yes | Yes | 0.22 | 0.08 | 0.57 |
| Mn$_3$In | no | N/A | 0.73 | 0.82 | 0.54 |

TABLE II-continued

List of tetragonal ferrimagnetic Heusler alloys predicted to have same sign of native spin polarization for each termination layer and same sign of BZ filtering effect and total native spin polarization. Total spin polarization and spin polarization of the two distinct termination layers (Mn-Y and Mn-Z layer) are also included. Mn$_3$Ge and Mn$_2$CuSb are also included here for comparison. Some of them, marked as bold, show high spin polarization (>0.7) and/or BZ filtering effect. FIG. 5 illustrates the Mn-Y and Mn-Z terminations for Heuslers of the type Mn$_2$YZ.

| Heusler | BZ filtering | BZ filtering | spin pol. | spin pol. | spin pol. |
|---|---|---|---|---|---|
| Mn$_3$Al | no | N/A | 0.43 | 0.52 | 0.30 |
| Mn$_2$FeGa | no | N/A | −0.58 | −0.71 | −0.33 |
| Mn$_2$OsSb | no | N/A | −0.46 | −0.26 | −0.78 |
| Mn$_2$IrGe | no | N/A | −0.64 | −0.46 | −0.87 |
| Mn$_2$IrGa | no | N/A | 0.57 | 0.72 | 0.22 |
| Mn$_2$IrSn | no | N/A | −0.67 | −0.48 | −0.90 |
| Mn$_2$RuSb | no | N/A | −0.38 | −0.19 | −0.74 |
| Mn$_2$RhGa | no | N/A | 0.66 | 0.82 | 0.27 |
| Mn$_2$RhSb | no | N/A | 0.46 | 0.53 | 0.14 |
| Mn$_2$RhSn | no | N/A | −0.48 | −0.24 | −0.85 |
| Mn$_2$RhIn | no | N/A | 0.61 | 0.81 | 0.21 |
| Mn$_2$PdGa | no | N/A | 0.48 | 0.65 | 0.02 |

Mn$_3$Ge and Mn$_2$CuSb Film Deposition and Characterization

Mn$_3$Ge and Mn$_2$CuSb films were deposited by dc-magnetron sputtering or IBD. Film compositions were measured by Rutherford back scattering measurements. X-ray diffraction measurements were carried out using a Bruker GADDS or a Bruker D8 Discover system. AFM film characterization was made with a Bruker Icon Dimension with ScanAsyst system. HRTEM and EELS studies were made using a JEOL ARM 200F with a Cold-FEG source operated at 200 keV. Magnetic properties were measured at 300 K using a Quantum Design superconducting quantum interference device vibrating sample magnetometer (SQUID-VSM) in magnetic fields of up to ±7 T in both in-plane and out-of-plane directions. Uniaxial magnetic anisotropy K$_U$ values were calculated from $K_U = H_{eff} \cdot M_S/2 + 2\pi M_S^2$ (with H$_{eff}$ being the effective magnetic field and M$_S$ the saturation magnetization).

Magnetic Tunnel Junction Fabrication and Characterization

MTJ devices were encapsulated in Al$_2$O$_3$. Electrical contacts were formed from 50 Å Ru/650 Å Au. TMR of the patterned devices was measured using a Quantum Design DynaCool physical property measurement system and a custom-built probe station with Keithley source meters 2602 and 2400. For fast evaluation of TMR, the R$_{AP}$ and R$_R$ values in FIG. 2C were measured at +0.3 T and −0.3 T, respectively, instead of sweeping the magnetic field from ±9 T.

Calculation Details

The electronic structure and transmission functions of Mn$_3$Ge/MgO/Fe, Mn$_2$CuSb/MgO/Fe, and Fe/MgO/Fe MTJs were calculated using a tight-binding linear muffin-tin orbital method in the atomic sphere approximation (TB-LMTO-ASA) with the local density approximation of density functional theory (LDA/DFT) for the exchange-correlation energy[13,14]. For the Mn$_3$Ge/MgO/Fe MTJ, the in-plane lattice constant was fixed to the experimental lattice constant a of bulk tetragonal Mn$_3$Ge (a=3.816 Å and c=7.261 Å). For Mn$_2$CuSb/MgO/Fe, the in-plane lattice constant was fixed to the calculated lattice constant a of the Mn$_2$CuSb tetragonal inverse ferrimagnetic phase a=3.95 Å (see Table I).

Relaxed positions of atoms at the Mn$_3$Ge/MgO and Mn$_2$CuSb/MgO interfaces (for all possible terminations)

were determined using the VASP molecular dynamic program[12]. The O-top configuration was found to be the most stable configuration (as compared to Mg-top and Mg-hollow) for both terminations at the $Mn_3Ge/MgO$ interface (in agreement with ref. 9), and for both terminations at the $Mn_2CuSb/MgO$ interface. For Fe/MgO interface the atomic positions from ref. 15 were used.

Magnetic Random Access Memory (MRAM) Application

A magnetic tunnel junction (MTJ) forms the basic memory element of a non-volatile magnetic random access memory (MRAM). A MTJ is a sandwich of two magnetic layers separated by an ultra-thin insulating layer referred to as a tunnel barrier. One of the magnetic layers forms the memory or storage layer, and the other layer forms a reference layer whose magnetic structure remains unchanged during operation of the MRAM. The magnetic state of the MTJ is changed by passing an electrical current through it. This current that tunnels between the reference and memory magnetic layers is spin-polarized: The magnitude of the tunneling spin-polarization is determined by a combination of the electronic properties of the magnetic electrodes and "spin-filtering" properties of the tunnel barrier. The magnitude of the current to switch a MTJ device is less when the magnetization of the magnetic layers is perpendicular to the layer. The materials claimed in this patent are expected to have large perpendicular magnetic anisotropy needed to build deeply scaled MRAM. Furthermore, these materials are expected to yield MTJs with high TMR.

The invention may be embodied in other specific forms without departing from its spirit or essential characteristics. The described embodiments are to be considered in all respects only as illustrative and not restrictive. The scope of the invention is therefore indicated by the appended claims rather than the foregoing description. All changes within the meaning and range of equivalency of the claims are to be embraced within that scope.

REFERENCES

1 Parkin, S. S. P. MgO Tunnel barriers and method of formation. U.S. Pat. No. 8,008,097 (2011 (filed Aug. 22, 2003)).
2 Parkin, S. S. P. et al. Giant Tunneling Magnetoresistance at Room Temperature with MgO (100) Tunnel Barriers. *Nat. Mater.* 3, 862-867, (2004).
3 Ikeda, S. et al. A perpendicular-anisotropy CoFeB—MgO magnetic tunnel junction. *Nat. Mater.* 9, 721-724, (2010).
4 Sato, H. et al. Properties of magnetic tunnel junctions with a MgO/CoFeB/Ta/CoFeB/MgO recording structure down to junction diameter of 11 nm. *Appl. Phys. Lett.* 105, 062403, (2014).
5 Graf, T., Felser, C. & Parkin, S. S. P. Simple rules for the understanding of Heusler compounds. *Prog. Solid State Chem.* 39, 1-50, (2011).
6 Balke, B., Fecher, G. H., Winterlik, J. & Felser, C. $Mn_3Ga$, a compensated ferrimagnet with high Curie temperature and low magnetic moment for spin torque transfer applications. *Appl. Phys. Lett.* 90, 152504, (2007).
7 Kurt, H. et al. Magnetic and electronic properties of $D0_{22}$-$Mn_3Ge$ (001) films. *Appl. Phys. Lett.* 101, 132410, (2012).
8 Li, M., Jiang, X., Samant, M. G., Felser, C. & Parkin, S. S. P. Strong dependence of the tetragonal $Mn_{2.1}Ga$ thin film crystallization temperature window on seed layer. *Appl. Phys. Lett.* 103, 032410, (2013).
9 Miura, Y. & Shirai, M. Theoretical Study on Tunneling Magnetoresistance of Magnetic Tunnel Junctions with $D0_{22}$-$Mn_3Z$ (Z=Ga, Ge). *IEEE Trans. Magn.* 50, 1400504, (2014).
10 Zhang, D. et al. First-principles study of the structural stability of cubic, tetragonal and hexagonal phases in Mn 3 Z (Z=Ga, Sn and Ge) Heusler compounds. *J. Phys.: Cond. Matt.* 25, 206006, (2013).
11 Faleev, S. V., Parkin, S. S. P. & Mryasov, O. N. Brillouin zone spin filtering mechanism of enhanced TMR and correlation effects in Co(0001)/h-BN/Co(0001) magnetic tunnel junction. *arXiv:* 1504.01017, (2015).
12 Kresse, G. & Furthmüller, J. Efficient iterative schemes for ab initio total-energy calculations using a plane-wave basis set. *Phys Rev. B* 54, 11169-11186, (1996).
13 Turek, I., Drchal, V., Kudrnovsky, J., Sob, M. & Weinberger, P. *Electronic structure of disordered alloys, surfaces and interfaces.* (Kluwer, 1997).
14 Schilfgaarde, M. v. & Lambrecht, W. R. L. in *Tight-binding approach to computational materials science MRS Symposia Proceedings* (eds L. Colombo, A. Gonis, & P. Turchi) (MRS, 1998).
15 Wortmann, D., Bihlmayer, G. & Blügel, S. Ab initio calculations of interface effects in tunnelling through MgO barriers on Fe(100). *J. Phys.: Condens. Matter* 16 S5819-S5822 (2004).
16 Butler, W. H., Zhang, X.-G., Schulthess, T. C. & MacLaren, J. M. Spin-dependent tunneling conductance of Fe|MgO|Fe sandwiches. *Phys. Rev. B* 63, 054416, (2001).

The invention claimed is:

1. A layered stack, comprising:
   a first layer having a first tunneling spin polarization and a first magnetic moment of a first magnitude; and
   a second layer having a second tunneling spin polarization and a second magnetic moment of a second magnitude different from the first magnitude,
   wherein:
   (i) the first and second layers are in physical contact with each other;
   (ii) the first and second tunneling spin polarizations have the same orientation; and
   (iii) the first and second magnetic moments have opposite orientations.

2. The layered stack of claim 1, wherein:
   the first layer includes Mn and Co; and
   the second layer includes Mn and Sn.

3. The layered stack of claim 1, wherein each of the first and second layers includes Mn.

4. The layered stack of claim 1, wherein:
   the first layer includes Mn and Os; and
   the second layer includes Mn and Sn.

5. The layered stack of claim 1, wherein:
   the first layer includes Mn and W; and
   the second layer includes Mn and Sb.

6. The layered stack of claim 1, wherein:
   the first layer includes Mn and Ru; and
   the second layer includes Mn and Sn.

7. The layered stack of claim 1, wherein:
   the first layer includes Mn; and
   the second layer includes Mn and Sb.

8. The layered stack of claim 1, wherein:
   the first layer includes Mn; and
   the second layer includes Mn and Al.

9. The layered stack of claim 1, wherein:
   the first layer includes Mn; and
   the second layer includes Mn and In.

10. The layered stack of claim 1, comprising a tunnel barrier that is contact with both the first layer and the second layer.

11. The layered stack of claim 10, wherein the tunnel barrier includes MgO.

12. The layered stack of claim 10, comprising a first electrode in contact with the tunnel barrier, wherein the first layer and the second layer form a second electrode.

13. The layered stack of claim 1, wherein the first and second magnetic moments are oriented perpendicular to the first and second layers.

14. A method, comprising:
 passing current through the layered stack of claim 1, the stack acting as a reference layer in a storage device.

15. A method, comprising:
 passing current through the layered stack of claim 1, the stack acting as a free layer in a storage device.

\* \* \* \* \*